(12) United States Patent
Fujieda et al.

(10) Patent No.: US 7,777,404 B1
(45) Date of Patent: Aug. 17, 2010

(54) FIELD EMISSION TYPE ELECTRON GUN COMPRISING SINGLE FIBROUS CARBON ELECTRON EMITTER AND OPERATING METHOD FOR THE SAME

(75) Inventors: Tadashi Fujieda, Mito (JP); Kishio Hidaka, Hitachiota (JP); Mitsuo Hayashibara, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 812 days.

(21) Appl. No.: 11/523,001

(22) Filed: Sep. 19, 2006

(30) Foreign Application Priority Data

Sep. 21, 2005 (JP) ............................. 2005-273051

(51) Int. Cl.
*H01J 19/06* (2006.01)
*H01K 1/04* (2006.01)

(52) U.S. Cl. ................... 313/346 R; 313/311; 313/495; 313/497; 977/743; 977/745

(58) Field of Classification Search ......... 313/495–497, 313/306, 309–311, 346, 351, 355, 293–304, 313/491, 632; 315/169.3, 169.5, 169.4; 977/742–750
See application file for complete search history.

(56) References Cited

U.S. PATENT DOCUMENTS

| | | | | |
|---|---|---|---|---|
| 5,994,833 | A * | 11/1999 | Seko et al. | 313/495 |
| 6,869,574 | B2 * | 3/2005 | Hojoh et al. | 422/186 |
| 7,375,366 | B2 * | 5/2008 | Ohki et al. | 257/10 |
| 2003/0151352 | A1 * | 8/2003 | Yamaguchi | 313/495 |

FOREIGN PATENT DOCUMENTS

| | | |
|---|---|---|
| JP | 52-004162 | 1/1977 |
| JP | 52-127060 | 10/1977 |
| JP | 55-37060 | 9/1980 |
| JP | 8-45455 | 2/1996 |
| JP | 8-167396 | 6/1996 |
| JP | 11-144663 | 5/1999 |
| JP | 2002-208368 | 7/2002 |
| JP | 2003-100244 | 4/2003 |
| JP | 2005-243389 | 9/2005 |

OTHER PUBLICATIONS

Chinese Office Action issued in Chinese Patent Application No. CN 2006101392369, dated Jan. 9, 2009.

* cited by examiner

*Primary Examiner*—Sikha Roy
*Assistant Examiner*—Jose M Diaz
(74) *Attorney, Agent, or Firm*—McDermott Will & Emery LLP

(57) ABSTRACT

Means for achieving the purpose of the present invention includes an field emission type cathode composed of a single fibrous carbon substance and a conductive substrate supporting the same; an extraction apparatus for causing field emission of electrons; and an accelerator for accelerating electrons, wherein the aforementioned field emission type electron gun is further contains means for heating the aforementioned field emission cathode, and means for applying the voltage of the polarity that does not allow the aforementioned field emission type cathode to field-emit electrons.

Thereby, the amorphous carbon is removed from the tip end of the fibrous carbon substance of the field emission type electron gun, without the tip end thereof being damaged.

7 Claims, 5 Drawing Sheets

FIELD EMISSION TYPE ELECTRON GUN COMPRISING SINGLE FIBROUS CARBON ELECTRON EMITTER AND OPERATING METHOD FOR THE SAME

CLAIM OF PRIORITY

The present application claims priority from Japanese application serial no. 2005-273051, filed on Sep. 21, 2005, the content of which is hereby incorporated by reference into this application.

FIELD OF THE INVENTION

The present invention relates to a field emission type electron gun and an operating method for the field emission type electron gun.

BACKGROUND OF THE INVENTION

According to the conventional art, a single crystal tungsten cathode is the only product that has been put into practical use as a field emission type cathode. If a field emission type electron gun using the single crystal tungsten cathode is used for two through twelve hours, the stability of emission current is affected by geometric changes on the cathode surface and the adsorption of gas to the surface of the cathode. This requires the step of heating and flushing on a periodic basis wherein the tungsten cathode is heated by current application. Flushing melts the surface of the cathode, and corrects the structures roughened by ion bombardment. Further, the atom adsorbed on the cathode surface is desorbed, whereby emission current stability is ensured.

Removal of adsorbed atoms from the cathode surface can also be achieved by field evaporation. This method is based on the fact that application of high field to the tip of the cathode causes removal of the adsorbed atom that takes place when the interaction between the field and the electric dipole of the adsorbed atom has exceeded the force of adsorbing the atom onto the atom. The Official Gazette of Japanese Patent Laid-open Sho 52 (1977)-127060 discloses a field evaporation method for cleaning the surface of the field emission type cathode made up of carbon material, carbide material or boride material. In this case, the cathode surface is not smoothed, and need not be smoothed.

SUMMARY OF THE INVENTION

Use of a carbon nanotube for a field emission type cathode provides the electron of a high degree of brightness wherein the energy width of the field emitted electron is reduced. This leads to instability in field emission characteristic although electron emission is allowed at a low voltage, with the result that a stable emission current cannot be obtained.

An object of the present invention is to solve the aforementioned characteristic problems and to provide a stable electron beam applied apparatus characterized by stable emission current.

FIG. 1 is an SEM photo of the tip end of the carbon nanotube in the field emission type cathode wherein a single carbon nanotube is bonded to the conductive substrate. This shows that the amorphous carbon layer (dotted line in FIG. 1) is present on the outermost layer of the carbon nanotube.

The carbon nanotube is bonded with the conductive substrate by application of electron beam inside the electron microscope. Fine hydrocarbons are present in the sample chamber of the electron microscope. When electron beam is applied to the carbon nanotube, the hydrocarbon is decomposed and the amorphous carbon is formed on the carbon nanotube. In presence of this amorphous carbon layer on the tip end of the carbon nanotube, the field emission characteristics are adversely affected, and stable emission current cannot be obtained. The amorphous carbon can be removed by the field evaporation and ion bombardment of the amorphous carbon through application of a high field to the cathode of the carbon nanotube. However, this method removes not only the amorphous carbon but also the carbon atom constituting the carbon nanotube. The tip end of the carbon nanotube is broken down and the tip end is left opened, as shown in FIG. 2. Such problems have been left unsolved in the conventional art.

Another object of the present invention is to provide a field emission type electron gun and method of operating the same, capable of removing the amorphous carbon present at the tip end thereof, without destroying the tip end of a fibrous carbon substance.

The second object of the present invention can be achieved by an field emission type electron gun including: an field emission type cathode composed of a single fibrous carbon substance and a conductive substrate supporting the same; an extraction apparatus for causing field emission of electrons; and an accelerator for accelerating electrons, wherein the aforementioned field emission type electron gun is further contains: means for heating the aforementioned field emission cathode; and means for applying the voltage of the polarity that does not allow the aforementioned field emission type cathode to field-emit electrons. To put it more specifically, the voltage of the polarity that does not allow the cathode to field-emit electrons is the voltage having the polarity opposite to that of the voltage that permits field emission of electrons.

A method for operating a field emission type electron gun according to the present invention is characterized by including the steps of: supplying the field emission type cathode with a voltage of the polarity that does not allow the field emission type cathode to field-emit electrons, while heating the aforementioned field emission type cathode for a predetermined time; and allowing the field emission type cathode to field-emit electrons thereafter. This procedure ensures that the thickness of the amorphous carbon present on the tip end of the fibrous carbon substance is kept at 1 nm or less, without destroying the tip end of the fibrous carbon substance. The means for achieving the second object of the present invention ensures that the field emission type electron gun and the method of operating the same according to the present invention is employed in various types of electron beam applied apparatuses.

Use of the aforementioned apparatus and operation method of the present invention makes it possible to remove the amorphous carbon from the tip end of the fibrous carbon substance of the field emission type electron gun without destroying the tip end thereof.

The aforementioned apparatus and operation method provide an electron beam applied apparatus characterized by stable emission current.

DESCRIPTION OF THE PREFERRED EMBODIMENTS

Figure 3:
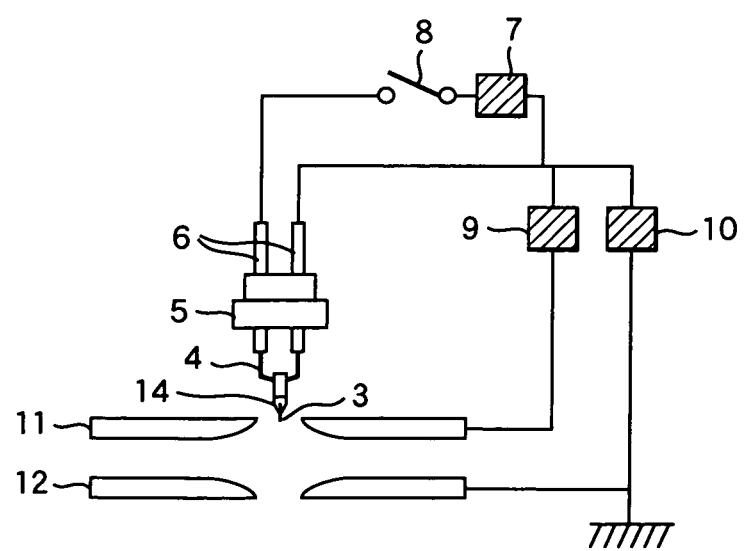
FIG. 3 is a schematic diagram showing a field emission type electron gun of the present embodiment.

The following describes the details of the embodiments of the present invention with reference to drawings:

FIG. 3 shows the configuration of an electron gun of the present embodiment. The electron gun of the present embodiment includes a field emission type cathode composed of a single fibrous carbon substance and a conductive substrate supporting the same;

an extraction apparatus 11 for causing field emission of electrons;

an acceleration electrode 12 for accelerating electrons, an extraction power supply 9 capable of applying voltages of both polarities between the extraction electrode and cathode;

an acceleration power supply 10 for applying voltage to the acceleration electrode;

a heating power supply 7 for heating the field emission type cathode by current application; and a power supply 9 for applying the voltage of the polarity that does not allow the aforementioned field emission type cathode to field-emit electrons.

Referring to FIG. 3, the following describes the specific method of operating the field emission type electron gun of the present invention: When the cathode is heated to 800° C. through current application by the heating power supply 7, the power supply 9 supplies the cathode with the voltage of the polarity that does not allow field emission of electrons from the cathode, namely, the positive voltage with respect to the extraction apparatus 11. This voltage applied must be such that the amorphous carbon on the tip end 3 of the fibrous carbon substance 14 is removed by field evaporation or ion bombardment. According to the test by the present inventors, the amorphous carbon can be removed from the tip end 3 of the fibrous carbon substance 14 by application of the voltage about 10 times the extraction voltage required to emit the electron. The extraction voltage is in the range from 100 V through 1 kV and clarification voltage is in the range from 1 kV through 20 kV, although these figures may vary according to the structure of an electron gun. If the clarification voltage is excessive, the tip end of the CNT will be broken. If it is insufficient, complete removal of the amorphous carbon, according to the test conducted by the present inventors, cannot be achieved.

The time for clarification varies according to the thickness of the amorphous carbon deposited on the CNT and the voltage used for clarification. If voltage is continued to be applied after the amorphous carbon has been removed by a very long-time clarification, the CNT itself will be damaged by ion bombardment. This is not preferred.

For clarification, only the CNT tip end 3 should be heated up to about 800° C. It is also possible to use the method of grilling the tip end by a heater 5, or indirect heating method, in addition to the method of heating by current application. From the viewpoint of temperature control and simplicity, heating by current application is preferred.

Figure 1:
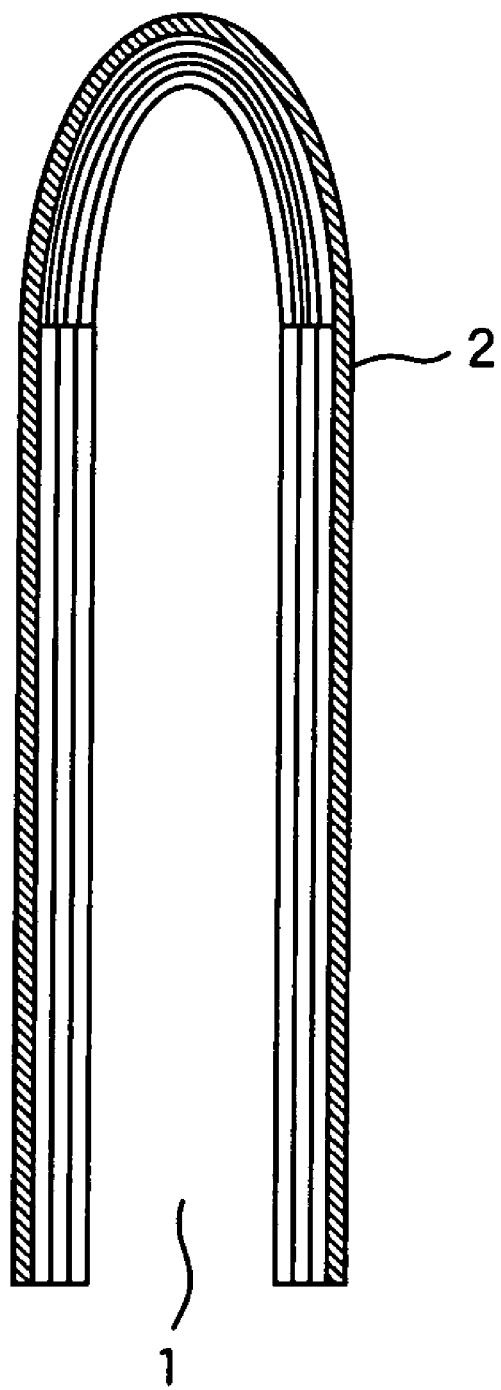
FIG. 1 is an SEM photo of the tip end of the carbon nanotube in the field emission type cathode wherein a single carbon nanotube is bonded to a conductive substrate.
Figure 2:
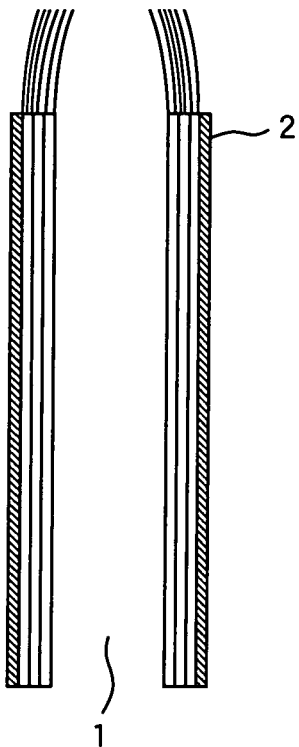
FIG. 2 is an SEM photo of the damaged and opened tip end of the carbon nanotube in the field emission type cathode wherein a single carbon nanotube is bonded to a conductive substrate.
Figure 4:
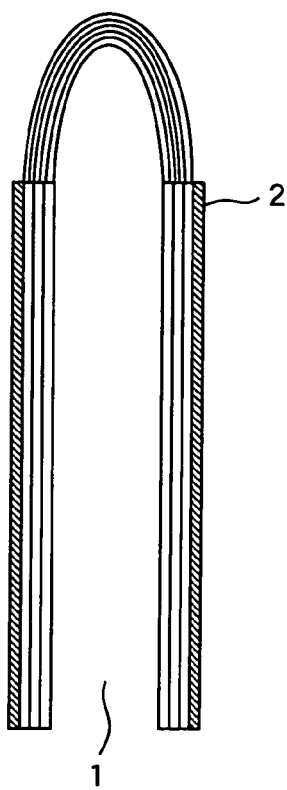
FIG. 4 is an SEM photo of the tip end of the carbon nanotube in the field emission type cathode wherein amorphous carbon has been removed by simultaneous heating/ field cleaning according to the present invention.

The present inventors have also confirmed that the tip end structure of the fibrous carbon substance is damaged, as shown in FIG. 2, when the amorphous carbon is removed from the tip end of the fibrous carbon substance by application of positive voltage without heating the cathode. The inventors also found out that the tip end of the fibrous carbon substance was repaired by itself when the cathode was heated up to 800° C. or more, concurrently as the positive voltage was applied. This procedure ensures removal of the amorphous carbon and clarification without damaging the tip end of the fibrous carbon substance, as shown in FIG. 4. This procedure will hereinafter be referred to as "simultaneous heating/field cleaning".

Upon completion of the simultaneous heating/field cleaning, heating by current application is performed in the same manner as that of the operation of the conventional field emission type electron gun. The polarity of the extraction power supply is switched so that the negative voltage is applied to the cathode, whereby electrons are emitted from the cathode. The simultaneous heating/field cleaning should be normally done at the time of replacing the cathode prior to initial operation. Once the amorphous carbon has been removed, it is hardly be deposited unless opened to the atmosphere. This is because, if cleaning operation is performed once at the time of replacing the cathode, there is no need of repeating the cleaning procedure thereafter.

The bonding strength between the fibrous carbon substance and the substrate supporting the same, and the heat resistance of the bonded section raise major problem when simultaneous heating/field cleaning is to be performed. The following describes the method of bonding between the fibrous carbon substance and the substrate supporting the same.

Figure 5A:
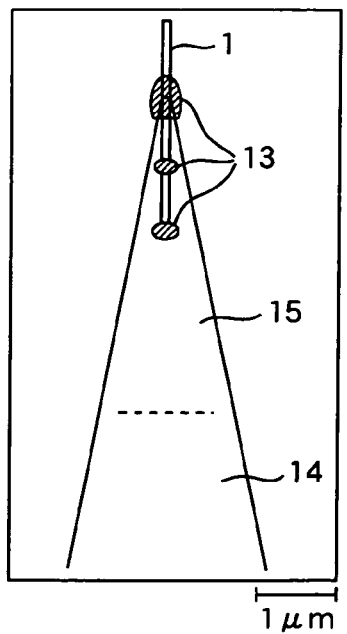
FIG. 5 is an SEM photo representing the tip end of the field emission type cathode of the present invention.
Figure 5B:
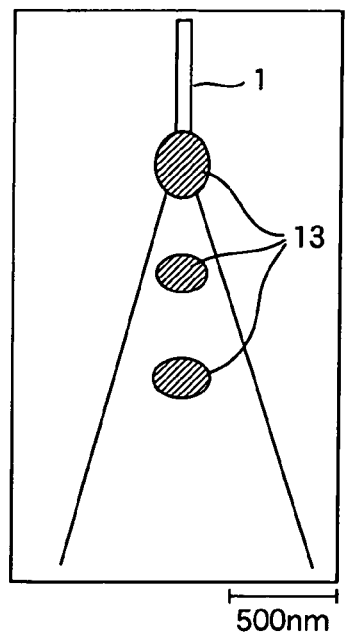

FIG. 5 is an SEM photo representing the tip end of the field emission type cathode of the present invention. The field emission type cathode is made up of a fibrous carbon substance such as a single carbon nanotube, a conductive substrate, an insulating support base for supporting the same, and an electrode. The connection between the fibrous carbon substance and conductive substrate is reinforced by the conductive coating layer.

There is no particular restriction to the material of the conductive substrate. A precious metal (specifically, gold, silver and platinum), crystalline carbon or metals of high melting point (specifically, tungsten, tantalum, niobium, molybdenum, etc.) are preferably used from the viewpoint of melting point, oxidation resistance and mechanical strength.

In order to control the angle between the center axis of the conductive substrate and fibrous carbon substance, a flat surface is formed by FIB processing and others on the conductive substrate tip end having been sharpened by chemical etching and other methods. If consideration is given to the radiation angle of the beam emitted from the carbon nanotube, the angle formed by the center axis of the conductive substrate and carbon nanotube must be within ±5°. Otherwise, the optical axis of the electron beam will be difficult to adjust.

The following describes how to ensure a sufficient bonding strength by forming a conductive coating layer on at least a part of the fibrous carbon substance mounted on the conductive substrate. A beam is applied to at least a part of the contact portion inside the chamber filled with a gas including the conductive element, whereby a conductive substrate having a sufficient thickness is formed in a short period of time. This procedure provides local coating of only the connection between the fibrous carbon substance and conductive substrate, without allowing a conductive coating element to be deposited on the fibrous carbon substance projecting from the conductive substrate, whereby reinforced bondage is ensured. The gas that can be decomposed only by a high-energy heavy ion beam such as a gallium ion beam conventionally used in the FIB and others cannot be used as the aforementioned gas including the conductive element. This is because, if the fibrous carbon substance is exposed to the high-energy heavy ion beam, the fibrous carbon substance per se will be damaged immediately and will be subjected to rupture or irradiated failure. For this reason, an electron beam of 100 keV or less that does not damage the fibrous carbon substance is preferably used as the particle ray used to decompose the gas. The preferably used gas is exemplified by a pyrene monomer or tungsten carbonyl that can be decomposed by the electron beam of 100 keV or less and can be vaporized at 100° C. or less, or the tungsten fluoride that can be vaporized at a room temperature. When these gases are exposed to electron beams, a conductive material such as a carbon layer and tungsten layer can be formed on only the connection between the carbon nanotube and conductive substrate.

Simultaneous heating/field cleaning of the present invention is implemented by the use of a field emission type cathode made up of the single fibrous carbon substance produced by the aforementioned procedure.

(Example 1 of Application to an Electron Beam Applied Apparatus)

Figure 6:
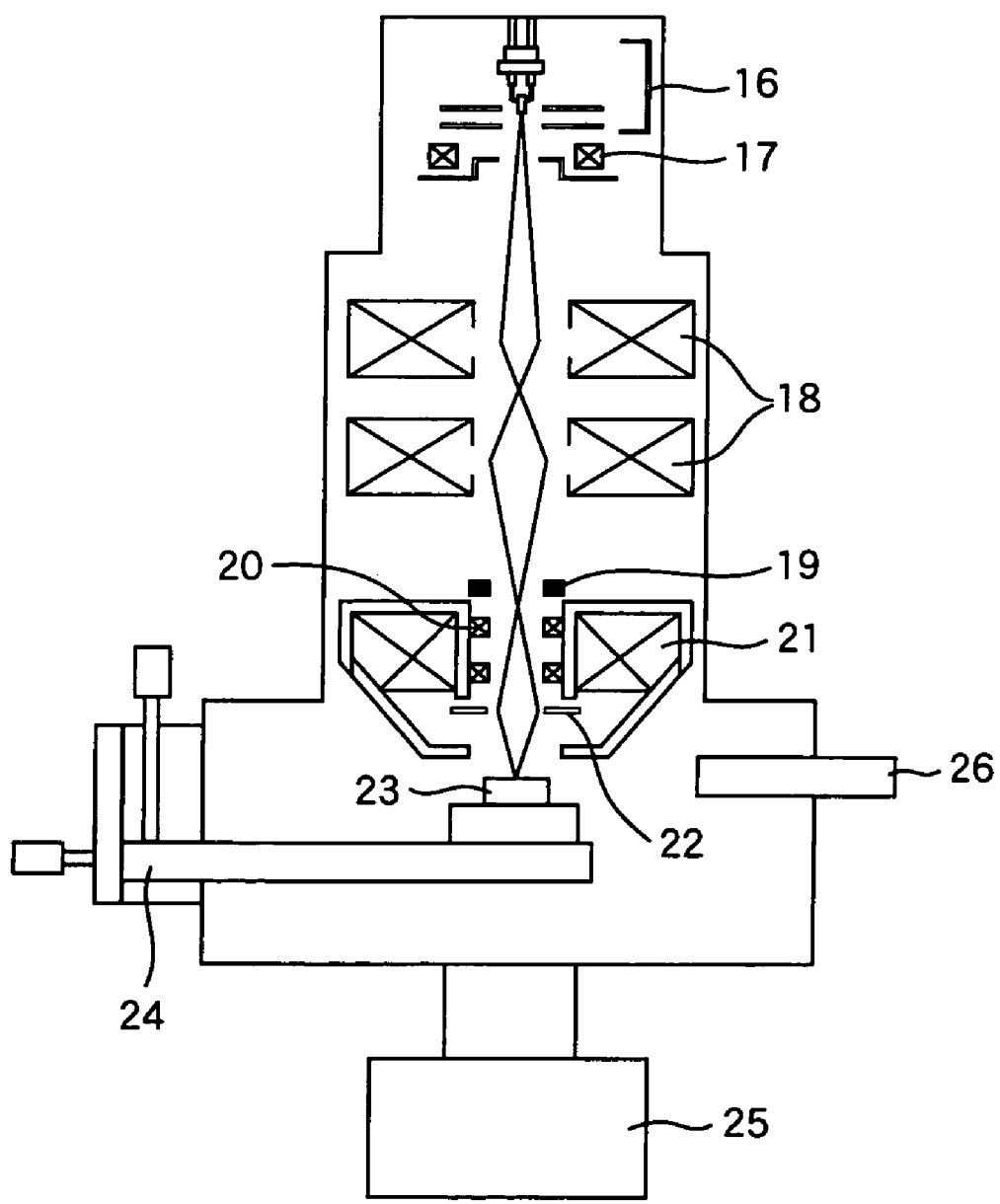
FIG. 6 is an overall schematic diagram representing the scanning electron microscope using the field emission type electron gun of the present invention.

FIG. 6 is an overall schematic diagram representing the scanning electron microscope (SEM) using the electron gun of the present invention. The scanning electron microscope includes an alignment coil 17, condenser coil 18, astigmatic correction coil 20, deflection/scanning coil 21, objective lens 22 and objective aperture 19, which are arranged along the electron beam emitted from the electron gun. A sample is placed on a sample stage so as to be exposed to electron beams. A secondary electronic detector 26 is arranged on the side wall in the sample chamber. The sample chamber is kept at a high vacuum by an exhaust system 25. This arrangement ensures that the electron beam emitted from the electron gun is accelerated by an anode 16 and is focused by an electronic lens 22, whereby the electron beam is applied to the minute area on the sample 23. This irradiated area is exposed to secondary scanning and the secondary electron emitted from the sample 23 and reflected electron are detected by the secondary electronic detector 26. Thus, an enlarged image is formed based on the difference in the amounts of the detected signal.

Application of the electron gun of the present invention and the operation method thereof to the scanning electron microscope provides a scanning electron microscope capable of producing a secondary electronic image and reflected image of much higher resolution and brightness than those of the conventional system. Such an electronic image and reflected image can be obtained continuously for a longer period of time under stable conditions.

The electron gun of the present invention and the operation method thereof can be also applied to the SEM for length measurement which is used for observation of a micromachined pattern and measurement of dimensions in a semiconductor manufacturing process. It should be noted that the basic configuration of the electronic optical system of the SEM for length measurement is the same as that given in FIG. 6.

The configuration of the scanning electron microscope provided with the field emission type electron gun is not restricted to that shown in FIG. 6. A conventional technique having been developed heretofore can be used if it is capable of utilizing the characteristics of the field emission type electron gun.

(Example 2 of Application to an Electron Beam Applied Apparatus)

Figure 7:
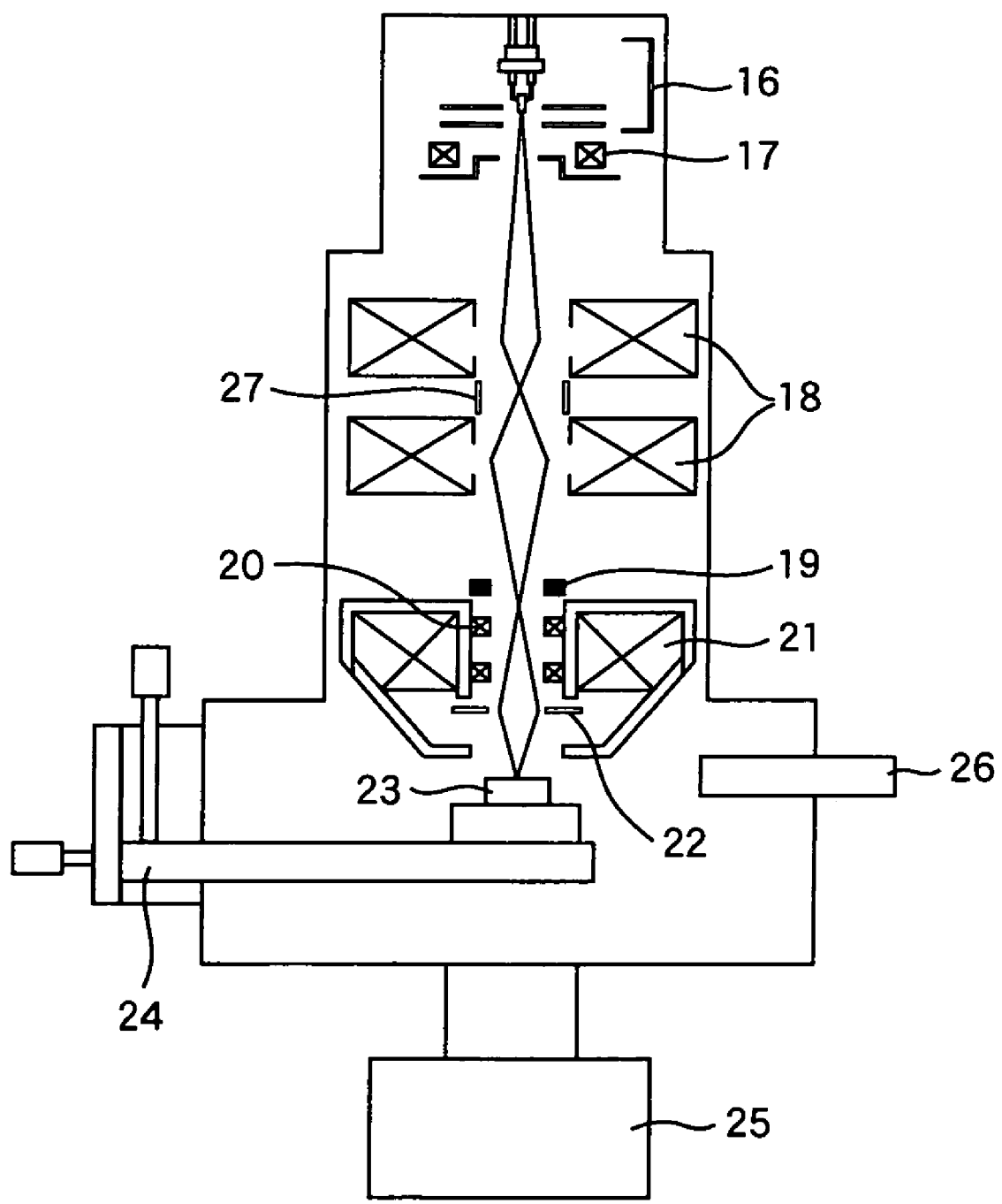
FIG. 7 is an overall schematic diagram representing the electron beam exposure apparatus provided with the field emission type electron gun of the present invention.

FIG. 7 is an overall schematic diagram representing the electron beam exposure apparatus provided with the electron gun of the present invention. The basic configuration of the electronic optical system is the same as that of the scanning electron microscope shown above. The electron beam obtained by field emission from the electron gun is condensed by the condenser lens 27 and is further condensed onto the sample by an objective lens 22, whereby a beam spot having a diameter of the order of several nanometers is obtained. In this case, the center of the blanking electrode preferably conforms to the cross-over point created by the condenser lens.

Electron beam exposure is provided by applying an electron beam on the sample, while turning on and off the electron beam with the blanking electrode, and polarizing and scanning the electron beam on the sample with a deflecting/scanning coil.

The electron beam exposure apparatus produces various types of circuit patterns by applying an electron beam the sample substrate coated with a resist capable of sensing electron beams. In keeping up with the definition of a circuit pattern getting higher and higher, there has been a growing demand for an electron gun capable of providing an ultra-thin probe diameter. A thermoelectronic emission type electron source made up of a tungsten filament or $LaB_6$ has been employed in the conventional art. Although this electron gun provides a large amount of bean current, a great deal of astigmatism results from the magnitude of the absolute emitter tip end radius. This gun fails to provide a beam exposure of 20 nm or less. In an effort to solve this problem, a field emission type electron gun composed of a single crystal tungsten cathode has come into use in recent years. This effort, however, has brought about a new problem of insufficiency and instability of beam current. To ensure reliable beam exposure, the amount of electron beam exposure, i.e. the time of exposure must be increased. This has led to inefficient operation. These and other problems can be solved by the electron gun of the present invention and the method of operating the same.

What is claimed is:

1. A field emission type electron gun comprising:
a field emission type cathode composed of a single fibrous carbon substance and a conductive substrate supporting the same;
an extraction apparatus for causing field emission of electrons; and
an accelerator for accelerating electrons;
wherein an amorphous layer coating said single fibrous carbon substance has a thickness of 1 nm or less, and the tip of said single fibrous carbon substance is closed.

2. The field emission type electron gun according to claim 1, wherein the single fibrous carbon substance is a carbon nanotube.

3. A field emission type electron microscope provided with the field emission type electron gun described in claim 1.

4. A length measuring SEM (scanning electron microscope) provided with the field emission type electron gun described in claim 1.

5. An electron beam exposure apparatus provided with the field emission type electron gun described in claim 1.

6. A method for operating a field emission type electron gun, said gun comprising:
- a field emission type cathode composed of a single fibrous carbon substance and a conductive substrate supporting the same, said cathode providing field emission by application of a first voltage;
- an extraction apparatus for causing field emission of electrons including an extraction electrode; and
- an accelerator for accelerating electrons;
- the method including the steps of:
- heating said single fibrous carbon substance to 800° C. or more;
- supplying a second voltage between said single fibrous carbon substance and said extraction electrode, the second voltage being the polarity opposite to that of said first voltage and higher than said first voltage, and in the range from 1 kV to 20 kV, while heating by said heater; and
- allowing said single fibrous carbon substance to field-emit electrons thereafter.

7. The method for operating a field emission type electron gun according to claim 6, wherein the operating method:
- provides a ground potential to the extraction electrode of an extraction apparatus made up of an extraction electrode and power supply;
- applies a positive voltage to said field emission type cathode to perform cleaning said electron source; and then
- applies a negative voltage to said field emission type cathode to cause field emission of electrons.

* * * * *